US009567210B2

(12) United States Patent
Cheng et al.

(10) Patent No.: US 9,567,210 B2
(45) Date of Patent: Feb. 14, 2017

(54) MULTI-PRESSURE MEMS PACKAGE

(71) Applicant: Taiwan Semiconductor Manufacturing Co., Ltd., Hsin-Chu (TW)

(72) Inventors: Chun-Wen Cheng, Zhubei (TW); Chia-Hua Chu, Zhubei (TW); Kuei-Sung Chang, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/629,738

(22) Filed: Feb. 24, 2015

(65) Prior Publication Data

US 2016/0244325 A1 Aug. 25, 2016

(51) Int. Cl.
*B81B 7/02* (2006.01)
*B81C 1/00* (2006.01)

(52) U.S. Cl.
CPC ............ *B81B 7/02* (2013.01); *B81C 1/00293* (2013.01); *B81B 2201/0235* (2013.01); *B81B 2201/0242* (2013.01); *B81B 2201/0257* (2013.01); *B81B 2201/0264* (2013.01); *B81B 2207/095* (2013.01); *B81C 2203/0109* (2013.01); *B81C 2203/0145* (2013.01)

(58) Field of Classification Search
None
See application file for complete search history.

(56) References Cited

U.S. PATENT DOCUMENTS

| 7,659,150 | B1* | 2/2010 | Monadgemi ........ B81C 1/00293 257/E23.193 |
|---|---|---|---|
| 8,580,594 | B2 | 11/2013 | Huang et al. |
| 2011/0215435 | A1 | 9/2011 | Wakimoto et al. |
| 2012/0043627 | A1 | 2/2012 | Lin et al. |
| 2012/0326248 | A1 | 12/2012 | Daneman et al. |
| 2013/0001710 | A1 | 1/2013 | Daneman et al. |
| 2013/0037891 | A1 | 2/2013 | Huang et al. |

(Continued)

FOREIGN PATENT DOCUMENTS

| CN | 101643193 A | 2/2010 |
| WO | 2013064632 A1 | 5/2013 |

OTHER PUBLICATIONS

Non Final Office Action Dated Nov. 2, 2015 U.S. Appl. No. 14/698,985.

(Continued)

*Primary Examiner* — Ali Naraghi
(74) *Attorney, Agent, or Firm* — Eschweiler & Associates, LLC

(57) ABSTRACT

The present disclosure relates to a microelectromechanical systems (MEMS) package having two MEMS devices with different pressures, and an associated method of formation. In some embodiments, the (MEMS) package includes a device substrate and a cap substrate bonded together. The bonded substrate comprises a first cavity corresponding to a first MEMS device having a first pressure and a second cavity corresponding to a second MEMS device having a different second pressure. The second cavity comprises a major volume and a vent hole connected by a lateral channel disposed between the device substrate and the cap substrate and the vent hole is hermetically sealed by a sealing structure.

20 Claims, 17 Drawing Sheets

(56) References Cited

U.S. PATENT DOCUMENTS

| | | |
|---|---|---|
| 2013/0099355 A1 | 4/2013 | Liu et al. |
| 2013/0265701 A1* | 10/2013 | Takizawa .............. H05K 5/069 |
| | | 361/679.01 |
| 2013/0277770 A1 | 10/2013 | Tsai et al. |
| 2014/0103461 A1 | 4/2014 | Chu et al. |
| 2014/0225206 A1 | 8/2014 | Lin et al. |
| 2014/0248730 A1 | 9/2014 | Huang et al. |

OTHER PUBLICATIONS

U.S. Appl. No. 14/013,155, filed Aug. 29, 2013.
Non-Final Office Action dated Aug. 13, 2014 for U.S. Appl. No. 14/013,155.
Notice of Allowance dated Jan. 13, 2015 for U.S. Appl. No. 14/013,155.
U.S. Appl. No. 14/041,298, filed Sep. 30, 2013.
Non-Final Office Action dated Oct. 6, 2014 for U.S. Appl. No. 14/041,298.
Notice of Allowance dated Jan. 22, 2015 for U.S. Appl. No. 14/041,298.
U.S. Appl. No. 14/557,513, filed Dec. 2, 2014.
Martin Tarr, "Hermatic Encapsulation," Website, 2009, Figure 1, http://www.mtarr.co.uk/courses/topics/0261_herm/index.html#top.
Non Final Office Action Dated Jul. 5, 2016 U.S. Appl. No. 14/557,513.
Notice of Allowance dated Jun. 29, 2016 for U.S. Appl. No. 14/698,985.

* cited by examiner

MULTI-PRESSURE MEMS PACKAGE

BACKGROUND

Microelectromechanical systems (MEMS) devices, such as accelerometers, pressure sensors, and microphones, have found widespread use in many modern day electronic devices. For example, MEMS accelerometers are commonly found in automobiles (e.g., in airbag deployment systems), tablet computers, or in smart phones. For some applications, various MEMS devices need to be integrated into one MEMS package; these may include some MEMS sensors requiring different pressures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
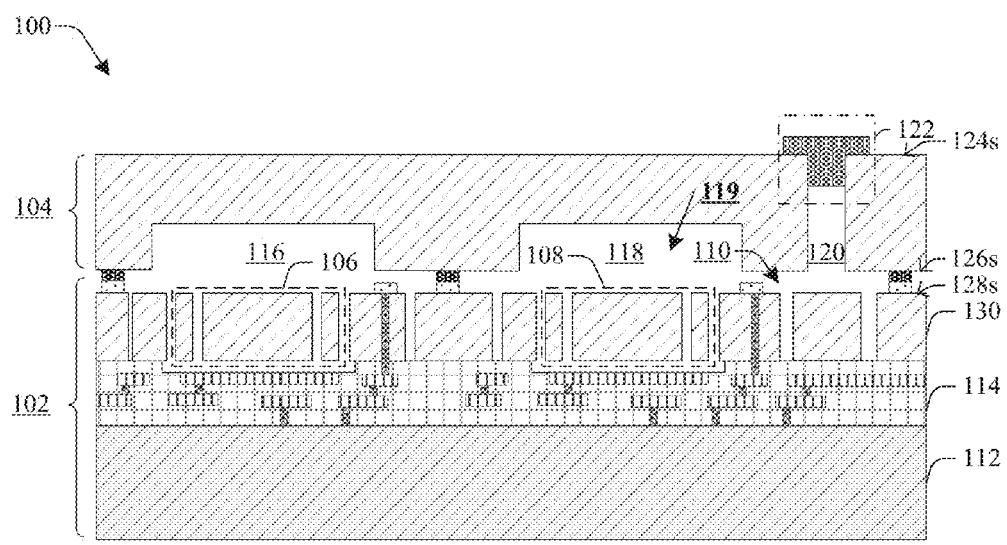
FIG. 1 illustrates a cross-sectional view of some embodiments of a microelectromechanical systems (MEMS) package.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Multiple MEMs device may be integrated onto a same integrated chip in recent generations of MEMs ICs. For example, motion sensors are used for motion-activated user interfaces in consumer electronics such as smartphones, tablets, gaming consoles, smart-TVs, and in automotive crash detection systems. To capture a complete range of movements within a three-dimensional space, motion sensors often utilize an accelerometer and a gyroscope in combination. The accelerometer detects linear movement. The gyroscope detects angular movement. To meet consumer demand for low cost, high quality, and small device footprint, the accelerometer and the gyroscope can be formed from microelectromechanical system (MEMS) devices, which are integrated together on a same substrate. Although they share the same substrate, and hence a same manufacturing process, the accelerometer and the gyroscope utilize different operating conditions. For example, the gyroscope is often packaged in a vacuum for optimal performance. In contrast, the accelerometer is often packaged at a predetermined pressure (e.g., 1 atmosphere) to produce a smooth frequency response.

Therefore, the present disclosure is directed to a MEMS package comprising multiple MEMS devices that are integrated together on a single substrate. The MEMS package comprises a device substrate and a cap substrate bonded together. The device substrate comprises first and second MEMS devices disposed in a horizontal plane on the substrate. The cap substrate comprises a first cavity arranged over the first MEMS device and a second cavity arranged over the second MEMS device. The second cavity comprises a major volume 119 and a vent hole, wherein the vent hole is sealed by a sealing structure, defining a second pressure of the second cavity that is different from a first pressure of the first cavity. To avoid unwanted residue into the major volume 119, the major volume 119 and the vent hole are spaced apart from each other and connected by a lateral channel disposed between the device substrate and the cap substrate. In some embodiments, the sealing structure comprises multiple layers comprising metal layers and dielectric layers.

FIG. 1 shows a cross-sectional view of a MEMS package 100 according to some embodiments. The MEMS package 100 comprises a device substrate 102 and a cap substrate 104 bonded together. In some embodiments, the device substrate 102 may comprise a semiconductor substrate 112 having active elements (e.g., a transistor), a interconnect layer 114 having metallization planes and via interconnects disposed within an inter-metal dielectric (IMD) material, and a MEMS substrate 130 having first MEMS device 106 and second MEMS device 108 disposed in a horizontal plane. The cap substrate 104 comprises a first cavity 116 arranged over the first MEMS device 106 and a second cavity 118 arranged over the second MEMS device 108. The second cavity 118 comprises a major volume 119 and a vent hole 120 connected by a lateral channel 110. In some embodiments, the lateral channel 110 is disposed between front side surfaces 126s and 128s of the cap substrate 104 and the device substrate 102. In some embodiments, the vent hole 120 has a lateral dimension in a range of about 3 μm to about 60 μm, and more specifically, larger than 10 μm. The vent hole 120 is sealed by a sealing structure 122 from a back side surface 124s of the cap substrate 104. In some embodiments, the first cavity 116 is hermetically sealed by bonding pads or bonding rings and filled with a first gas at a first gas pressure; while the second cavity 118 is sealed hermetically by bonding and the sealing structure 122 and filled with a second gas at a second gas pressure, which is different from the first gas pressure. By independently controlling the pressures within the first and second cavities 116, 118, performance of the semiconductor device 100 can be improved. For example, performance of a motion sensor having a first MEMS device 106 including an accelerometer, and a second MEMS device 108 including a gyroscope can be increased by independently controlling the pressures within the first and second cavities 116, 118, which independently optimizes function of the first and second MEMS devices 106, 108 (i.e., the accelerometer and the gyroscope).

Figures 2A, 2B:
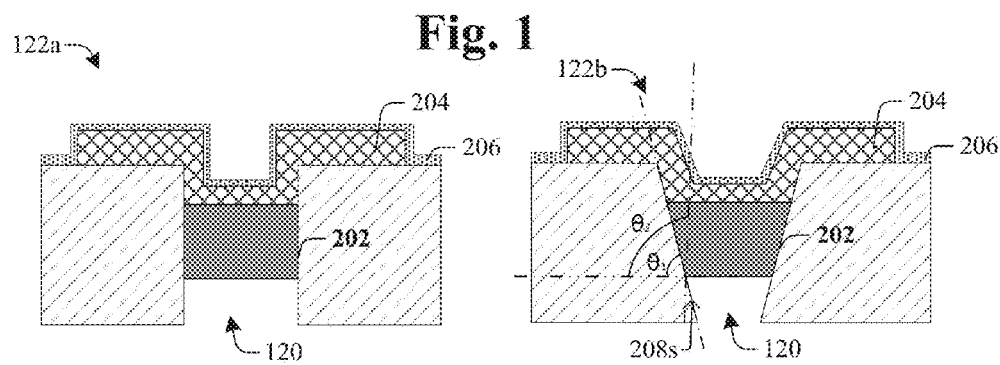
FIGS. 2A-2D illustrate cross-sectional views of some embodiments of a sealing structure of the MEMS package of FIG. 1.
Figures 2C, 2D:
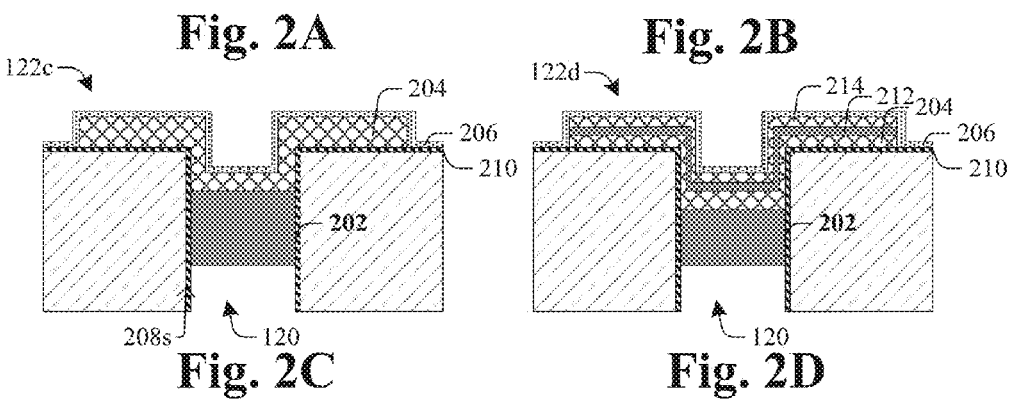

FIGS. 2A-2D show some cross-sectional views of the sealing structure 122 of the MEMS package 100 according to some embodiments. As shown in FIG. 2A, the sealing structure 122a comprises a first non-conductive sealing layer 202 disposed within the vent hole 120 and a first metal layer 204 disposed over the dielectric sealing layer 202. In some embodiments, the first non-conductive layer 202 can be organic or inorganic material and can be porous or solid. For example, the first non-conductive sealing layer 202 may comprise epoxy or glass frit. For example, the first metal layer 204 can be aluminum (Al), Titanium Tungsten (TiW), Titanium (Ti), Titanium Nitride (TiN), copper (Cu) or any combinations thereof. In some embodiments, the first metal layer 204 is a conformal layer that extends over a neighboring portion of the back side surface 124s of the cap substrate 104. In some embodiments, the first metal layer 204 is covered by a passivation layer 206 disposed thereon. As examples, the passivation layer 206 can be silicon oxide or silicon nitride. As shown in FIG. 2B, the sealing structure 122b comprises the first non-conductive sealing layer 202 disposed within the vent hole 120 and the first metal layer 204 disposed over the first non-conductive sealing layer 202 and covered by a conformal dielectric layer 206. In some embodiments, a sidewall 208s of the vent hole is tilted, for example, with a tilt angle θ, ranging from about 45 degrees ($\theta_1$) to about 95 degrees ($\theta_2$). As shown in FIG. 2C, the sealing structure 122c can further comprise a second metal layer 210 disposed along the sidewalls 208s of the vent hole 120. The second metal layer 210 may extend over a portion of the back side surface 124s of the cap substrate under the first metal layer 204 or the passivation layer 206. As shown in FIG. 2D, the sealing structure 122d can further comprise a second non-conductive sealing layer 212 and a third metal layer 214 disposed between the first metal layer 204 and the passivation layer 206. The second non-conductive sealing layer 212 and a second metal layer 214 may comprise same or different materials with the first dielectric layer 202 and the first metal layer 204 respectively. The first non-conductive layer 202 is utilized so that easy sealing can be achieved, especially for the case when the vent hole 120 is relative large (which has advantages of higher flow conductance). Utilization of additional metal layers, such as the first metal layer 204, the second metal layer 210, or the third meal layer 214, improves the reliability of the hermetic sealing, and helps to achieve stable and higher level hermetic sealing. This is because metal material has a better permeability performance (roughly smaller than $10^{-14}$ g/cm×Torr) than other organic/inorganic materials. For example, permeability of organic polymers is in a range of about $10^{-8}$-$10^{-12}$ g/cm×Torr.

Figure 3:
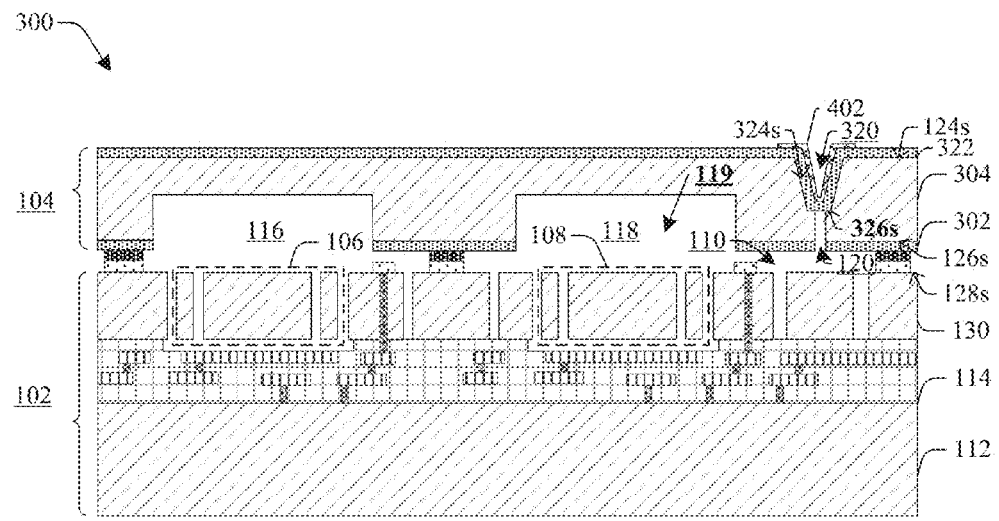
FIG. 3 illustrates a cross-sectional view of some alternative embodiments of a MEMS package.

FIG. 3 shows a cross-sectional view of a MEMS package 300 according to some other embodiments. The MEMS package 300 comprises a device substrate 102 and a cap substrate 104 enclosing a first cavity 116 over a first MEMS device 106 and a second cavity 118 over a second MEMS device 108. The second cavity 118 comprises a major volume 119 and a vent hole 120 connected by a lateral channel 110. In some embodiments, the lateral channel 110 is disposed between front side surfaces 126s and 128s of the cap substrate 104 and the device substrate 102. A vent opening 320 is disposed from a back side surface 124s of the cap substrate 104 connected to the vent hole 120. In some embodiments, the vent opening 320 has a width that is wider than that of the vent hole 120. Sidewalls 324s of the vent opening 320 can be either perpendicular or tilted and covered by a conformal dielectric layer 322 extending over the back side surface 124s of the cap substrate 104. The conformal dielectric layer 322 can be continuous at a bottom surface 326s of the vent opening 320, sealing the vent opening 320 to isolate the second cavity 118 from an ambient environment. In some embodiments, a metal layer 402 can be disposed on the conformal dielectric layer 322 configured to enhance sealing performance.

Figure 4:
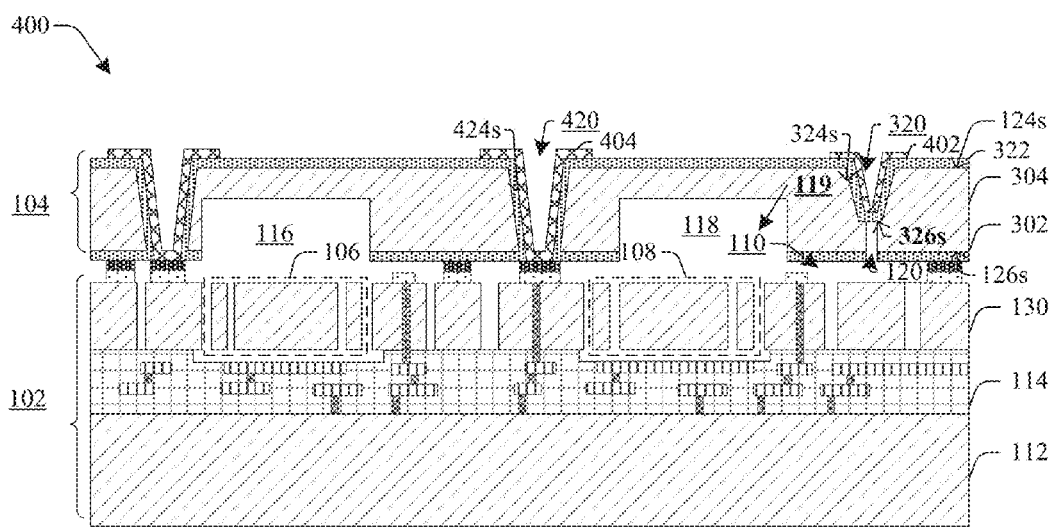
FIG. 4 illustrates a cross-sectional view of some alternative embodiments of a MEMS package.

FIG. 4 shows a cross-sectional view of a MEMS package 400 according to some other embodiments. The MEMS package 400 comprises a device substrate 102 and a cap substrate 104 enclosing a first cavity 116 over a first MEMS device 106 and a second cavity 118 over a second MEMS device 108. The second cavity 118 comprises a major volume 119 and a vent hole 120 connected by a lateral channel 110. In some embodiments, the lateral channel 110 is disposed between front side surfaces 126s and 128s of the cap substrate 104 and the device substrate 102. A vent opening 320 is disposed from a back side surface 124s of the cap substrate 104 connected to the vent hole 120. In some embodiments, the vent opening 320 has a width abutting the vent hole 120 that is wider than that of the vent hole 120. In some embodiments, the MEMS package 400 further comprises a through substrate via (TSV) 420 extending through the cap substrate 104 and electrically coupled to MEMS devices of the device substrate 102 by a second metal layer 404 covering sidewall 424s of the TSV 420. A conformal dielectric layer 322 can be disposed underneath the second metal layer 404. The conformal dielectric layer 322 can be extended to a sidewall 324s and a bottom surface 326s of the vent opening 320 continuously, sealing the vent opening 320 together with a first metal layer 402 to isolate the second cavity 118 from an ambient environment. The first and second metal layers 402 and 404 can be made of a same material. The vent opening 320 and the TSV 420 can have tilted sidewalls 324s and 424s that have substantially equal tilt angles.

Figure 5:
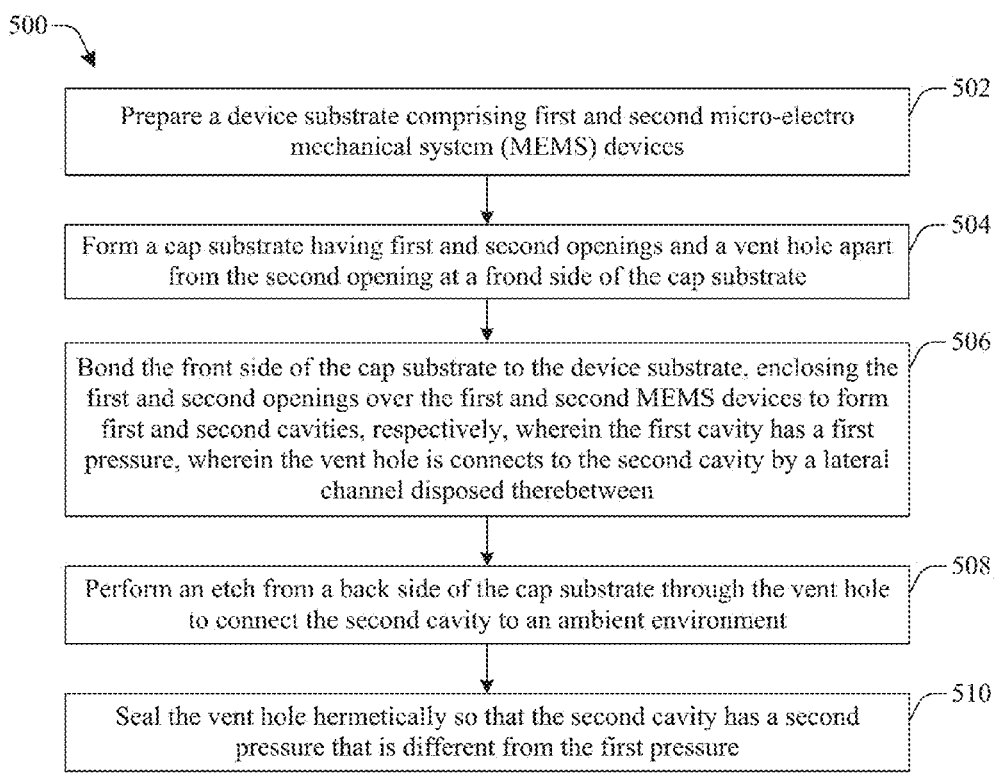
FIG. 5 illustrates a flow diagram of some embodiments of a method for manufacturing a MEMS package.

FIG. 5 shows a flow diagram 500 of a method for manufacturing a MEMS package according to some embodiments. The MEMS package comprises two MEMS devices configured to work under different pressure. Examples of the MEMS package are shown in FIG. 3.

While disclosed methods (e.g., methods 500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At action 502, a device substrate is prepared. In some embodiments, the device substrate comprises a semiconductor substrate that is bonded to a MEMS substrate containing first and second MEMS devices. In some embodiments, the semiconductor substrate is electrically connected to the MEMS substrate by interconnection layers and one or more vias.

At action 504, a cap substrate is formed having first and second openings and a vent hole spaced apart from the second opening at a front side of the cap substrate.

At action 506, the cap substrate is bonded to the device substrate at the front side, enclosing the first and second openings over the first and second MEMS devices to form first and second cavities, respectively. The first cavity has a first pressure. The vent hole is connected to the second cavity by a lateral channel disposed therebetween.

At action 508, an etch is performed from a back side of the cap substrate through the vent hole to connect the second cavity to an ambient environment.

At action 510, the vent hole is sealed hermetically so that the second cavity has a second pressure that is different from the first pressure.

FIGS. 6-11 show a series of cross-sectional views that collectively depict formation of a MEMS package according to some embodiments. Although FIGS. 6-11 are described in relation to the method 500, it will be appreciated that the structures disclosed in FIGS. 6-11 are not limited to the method 500, but instead may stand alone as structures independent of the method 500. Similarly, although the method 500 is described in relation to FIGS. 6-11, it will be appreciated that the method 500 is not limited to the structures disclosed in FIGS. 6-11, but instead may stand alone independent of the structures disclosed in FIGS. 6-11.

Figure 6:
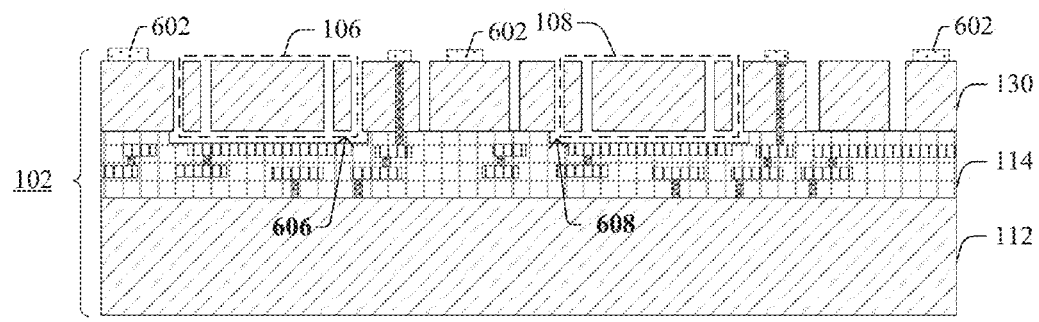
FIGS. 6-11 illustrate a series of cross-sectional views of some embodiments of a MEMS package at various stages of manufacture.

FIG. 6 shows a cross-sectional view corresponding to act 502 according to some embodiments. As shown in FIG. 6, a semiconductor substrate 112 is provided, which has been prepared through one or more fabrication processes. For example, the semiconductor substrate 112 includes one or more active elements. A series of metallization planes and via interconnects are disposed within an IMD layer 114 formed over an upper surface of the semiconductor substrate 112. First and second substrate cavities 606, 608 are formed in a top portion of the IMD material 114 corresponding to first and second MEMS devices 106, 108 that is subsequently positioned over the first and second substrate cavities 606, 608. In some embodiments, the first and second substrate cavities 606, 608 are formed by one or more of a wet etching process or a dry etching process. A MEMS substrate 130 comprising the first and second MEMS devices 106, 108 is bonded to the semiconductor substrate 112 through IMD layer 114 to form a device substrate 102. For example, the MEMS substrate 130 can be bonded to the IMD layer 114 by a fusion bonding process. In some embodiments, a fusion bonding is achieved between the IMD layer 114 comprising $SiO_2$ and the MEMS substrate 130 comprising Si. In some embodiments, the MEMS substrate 130 and/or the semiconductor substrate 112 is thinned down to reduce the thickness thereof after fusion bonding. In some embodiments, bonding elements 602 (bonding pads or bonding rings) are formed over the device substrate 102.

Figure 7:
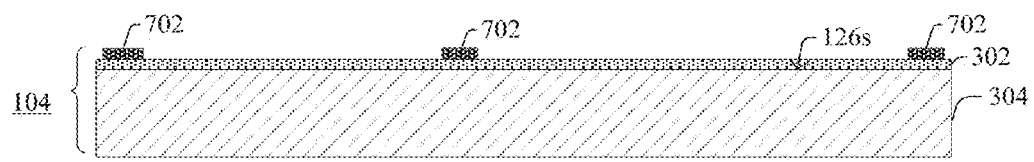
Figure 8:
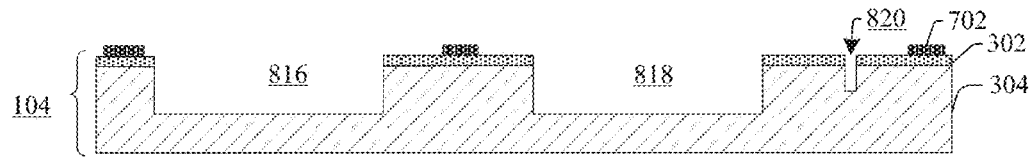

FIG. 7 and FIG. 8 show cross-sectional views corresponding to act 504 according to some embodiments. As shown in FIG. 7, a cap substrate 104 is prepared. In some embodiments, a passivation layer 302 is disposed over a silicon substrate 304. In some embodiments, bonding elements 702 (bonding pads or bonding rings) are formed over the silicon substrate 304 at positions corresponding to bonding elements 602 of the device substrate 102 for the following bonding. As examples, bonding pads of boding rings 702 can be made of metals such as aluminum (Al), germanium (Ge), gold (Au), copper (Cu), Tin (Sn) or alloys. As shown in FIG. 8, patterning and etching are performed to form a first recess 816 and a second recess 818. A vent hole recess 820 is formed apart from the second recess 818. The vent hole recess 820 has a width that is smaller than that of the first or second recess 816, 818. In some embodiments, the recesses 816, 818 and 820 can be formed by dry etching. The vent hole recess 820 can be patterned and etched by a single mask or etch process with the first and second recesses or by a separate mask or etch process. In some embodiments, a depth of the vent hole recess 820 may be smaller than that of the first or second recess 816 or 818 due to etch loading effect. In some embodiments, a portion of the passivation layer 302 and/or a portion of the silicon substrate 304 can be removed during the etching process to be prepared for a lateral channel formed in succession. Otherwise, the lateral channel can be formed between the bonded cap substrate and device substrate from the space bonding elements would introduce.

Figure 9:
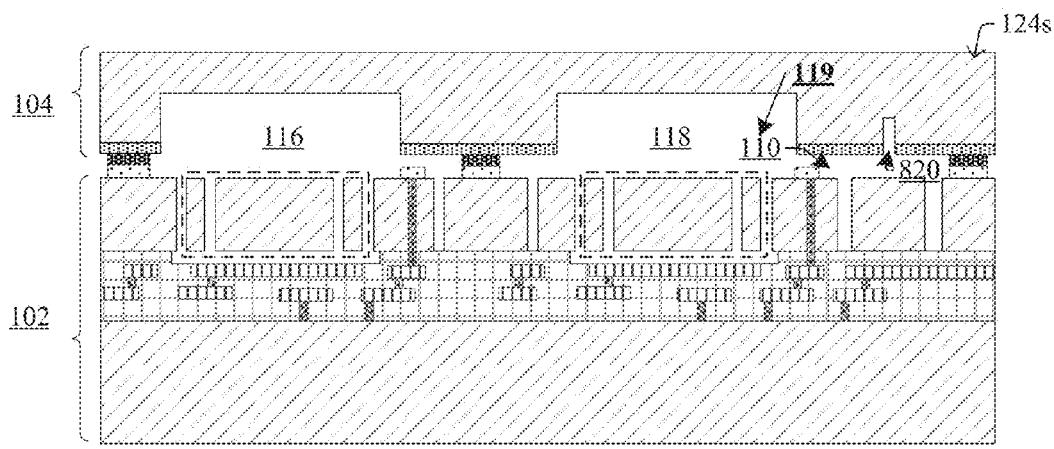

FIG. 9 shows a cross-sectional view corresponding to act 506 according to some embodiments. In FIG. 9, the cap substrate 104 is flipped over and bonded to the device substrate 102. For example, the bonding elements 702 of the cap substrate 104 are bonded by a eutectic bonding process to the corresponding bonding elements 602 of the device substrate 102, such that the device substrate 102 and the capping structure 104 are physically and electrically connected. Upon bonding, the first recess 816 becomes part of the first cavity 116; and the second recess 818, space 110 between the second recess 818 and the vent hole recess 820 (called lateral channel 110), and the vent hole recess 820 become part of the second cavity 118. In some embodiments, the cap substrate 104 is then thinned down to remove a partial thickness after being bonded to the device substrate 102.

In some embodiments, the eutectic bond includes a semiconductor-to-metal bonding between a semiconductor material and a metal material. In some embodiments, the semiconductor material includes at least one of Ge, Si, SiGe or another semiconductor material. In some embodiments, the metal material includes at least one of Al, Cu, Ti, Ta, Au, Ni, Sn, or another metal. Another example of eutectic bonding is a metal-to-metal bonding between two metal materials each including at least one of Al, Cu, Ti, Ta, Au, Ni, Sn, or another metal. The materials to be bonded are pressed against each other in an annealing process to form a eutectic phase of the materials. For example, a eutectic binding between Ge and Al is formed at an annealing temperature in a range from 400° C. to 450° C.

Figure 10:
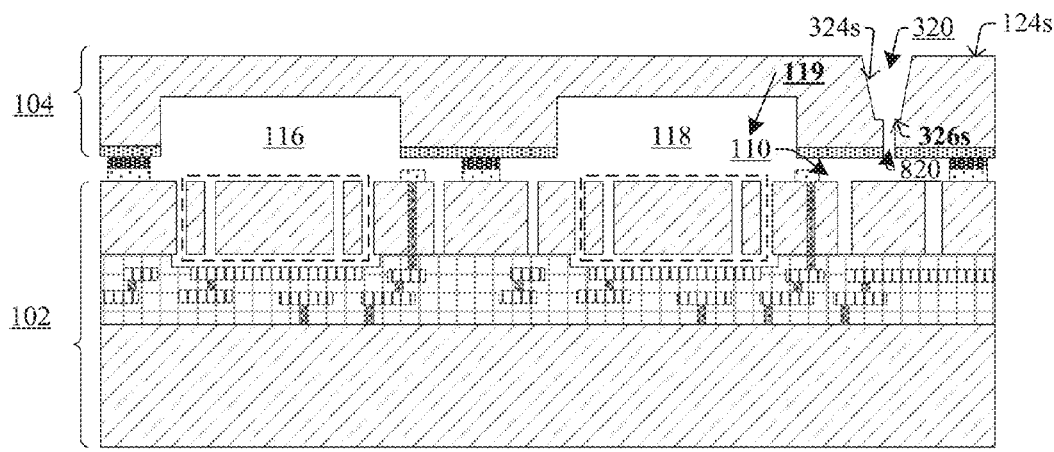

FIG. 10 shows a cross-sectional view corresponding to act 508 according to some embodiments. In FIG. 10, an etch is performed from a back side surface 124s of the cap substrate 104 directly above the vent hole recess 120. A vent opening 320 can be formed having a bottom surface 326s abutting the vent hole recess 820.

Figure 11:
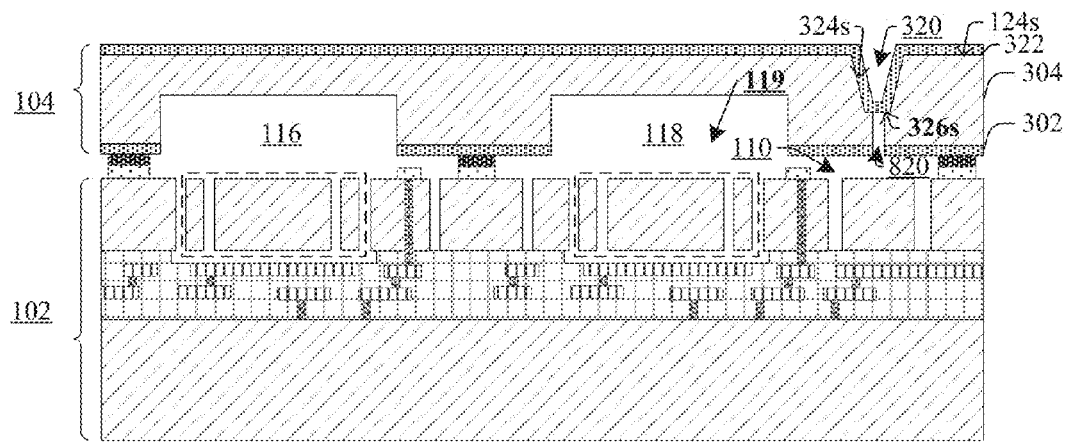

FIG. 11 shows a cross-sectional view corresponding to act 510 according to some embodiments. In FIG. 11, the pressure of the ambient environment surrounding the bonded cap substrate 104 and device substrate 102 is changed to the second gas pressure, and gas diffusion is allowed to occur through the vent opening 320, between the ambient environment and the second cavity 118. Once the gas diffusion reaches a steady-state condition, the pressure within the second cavity 118 is equal to the second gas pressure. Then a sealing layer 322 is formed to seal the vent opening 320 hermetically. In some embodiments, the sealing layer 322 can be formed to be a conformal layer from the back side surface 124s of the cap substrate 104, continuously along sidewalls 324s of the vent opening, covering the bottom surface 326s of the vent opening 320. In some embodiments, the sealing layer 322 can be a conformal thin film formed by chemical vapor deposition (CVD) or plasma enhanced chemical vapor deposition (PECVD).

Figure 12:
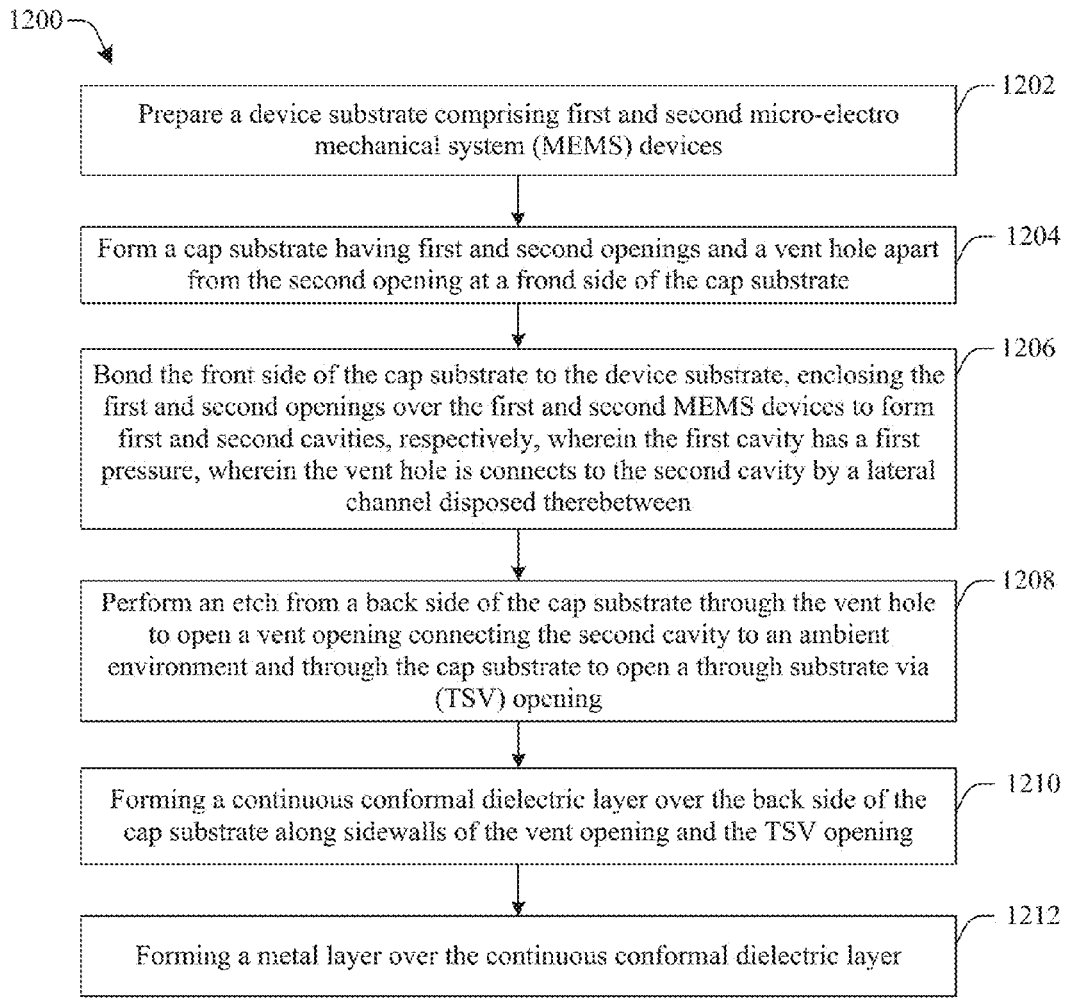
FIG. 12 illustrates a flow diagram of some alternative embodiments of a method for manufacturing a MEMS package.

FIG. 12 shows a flow diagram 1200 of a method for manufacturing a MEMS package according to some alternative embodiments. The MEMS package comprises two MEMS devices configured to work under different pressure. Examples of the MEMS package are shown in FIG. 4.

While disclosed methods (e.g., methods 1200) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At action 1202, a device substrate is prepared. In some embodiments, the device substrate comprises a semiconductor substrate that is bonded to a MEMS substrate containing first and second MEMS devices.

At action 1204, a cap substrate is formed having first and second openings and a vent hole apart from the second opening at a front side of the cap substrate.

At action 1206, the cap substrate is bonded to the device substrate at the front side, enclosing the first and second openings over the first and second MEMS devices to form first and second cavities, respectively. The first cavity has a first pressure. The vent hole is connected to the second cavity by a lateral channel disposed therebetween.

At action 1208, an etch is performed from a back side of the cap substrate through the vent hole to open a vent opening connecting the second cavity to an ambient environment and through the cap substrate to open a through substrate via (TSV) opening, such as a through silicon via opening for example.

At action 1210, the vent hole is sealed by forming a continuous conformal dielectric layer over the back side of the cap substrate along sidewalls of the vent opening and the TSV opening.

At action 1212, an etch is performed to remove an portion of the continuous conformal dielectric layer at a bottom surface of the TSV opening and metal layer is formed over the remaining conformal dielectric layer.

FIGS. 13-19 show a series of cross-sectional views that collectively depict formation of a MEMS package according to some embodiments. Although FIGS. 13-19 are described in relation to the method 1200, it will be appreciated that the structures disclosed in FIGS. 13-19 are not limited to the method 1200, but instead may stand alone as structures independent of the method 1200. Similarly, although the method 1200 is described in relation to FIGS. 13-19, it will be appreciated that the method 1200 is not limited to the structures disclosed in FIGS. 13-19, but instead may stand alone independent of the structures disclosed in FIGS. 13-19.

Figure 13:
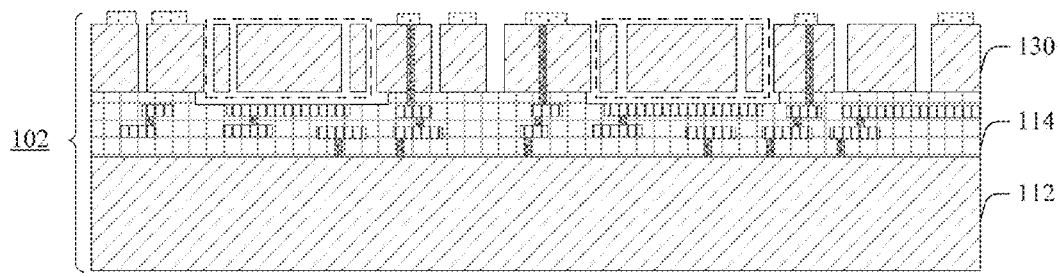
FIGS. 13-19 illustrate a series of cross-sectional views of some alternative embodiments of a MEMS package at various stages of manufacture.

FIG. 13 shows a cross-sectional view corresponding to act 1202 according to some embodiments. As shown in FIG. 13, a semiconductor substrate 112 is provided, which has been prepared through one or more fabrication processes. For example, the semiconductor substrate 112 includes one or more active elements. A series of metallization planes and via interconnects are disposed within an IMD layer 114 formed over an upper surface of the semiconductor substrate 112. The semiconductor substrate 112 is typically planar with a uniform thickness. Further, the semiconductor substrate 112 is n- or p-type, and can, for example, be a silicon wafer, such as a Si bulk wafer or a silicon-on-insulator (SOI) wafer. If present, an SOI substrate is often made up of an active layer of high quality silicon, which is arranged over a handle wafer and is separated from the handle wafer by a buried oxide layer. In some other embodiments, the semiconductor substrate can also be a sapphire substrate, a binary compound substrate (e.g. a III-V substrate), or other higher order compound substrate, with or without additional insulating or conducting layers formed thereover, among others.

Figure 14:
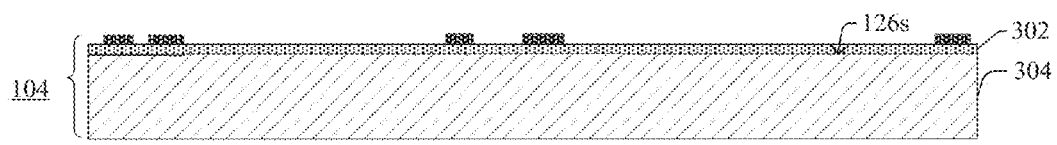
Figure 15:
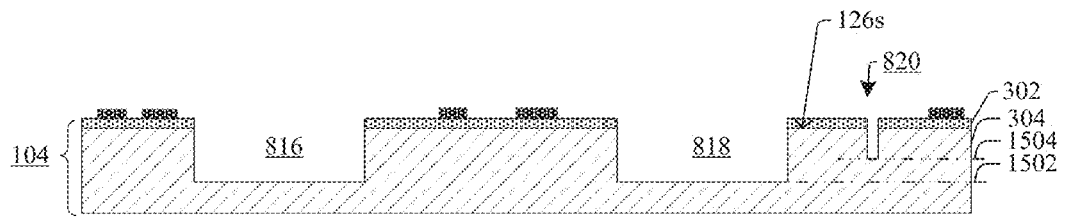

FIG. 14 and FIG. 15 show cross-sectional views corresponding to act 1204 according to some embodiments. As shown in FIG. 14, a cap substrate 104 is prepared. In some embodiments, a passivation layer 302 is disposed over a silicon substrate 304. As shown in FIG. 15, patterning and etching are performed to form a first recess 816 and a second recess 818. A vent hole recess 820 is formed apart from the second recess 818. The vent hole recess 820 has a width that is smaller than that of the first or second recess 816, 818. In some embodiments, the recesses 816, 818 and 820 can be formed by dry etching. The vent hole recess 820 can be patterned and etched by a single mask or a single etch process with the first and second recesses 816, 818 or by a separate mask and a separate etch process. In some embodiments, a depth of the vent hole recess 820 (at a lateral level 1504) may be smaller than that of the first or second recess 816 or 818 (at a lateral level 1502) due to etch loading effect. In some embodiments, a portion of the passivation layer 302 and/or a portion of the silicon substrate 304 can be removed during the etching process to be prepared for a lateral channel formed in succession. Otherwise, the lateral channel can be formed between the bonded cap substrate and device substrate from the space bonding elements would introduce.

Figure 16:
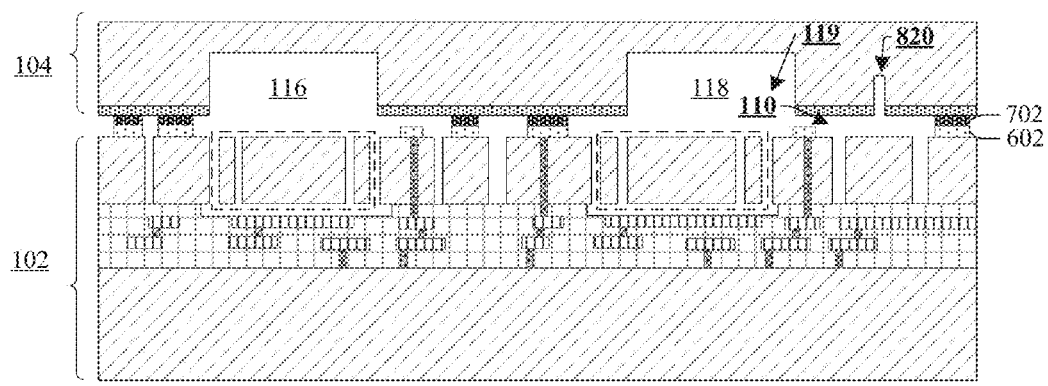

FIG. 16 shows a cross-sectional view corresponding to act 1206 according to some embodiments. In FIG. 16, the cap substrate 104 is flipped over and bonded to the device substrate 102. For example, in some embodiments, bonding elements 702 of the cap substrate 104 are bonded by a eutectic bonding process to corresponding bonding elements 602 of the device substrate 102, such that the device substrate 102 and the capping structure 104 are physically and electrically connected. In some other embodiments, the cap substrate 104 and the device substrate 102 can be bonded by any other applicable bonding techniques. Upon bonding, the first recess 816 becomes part of the first cavity 116; and the second recess 818, space 110 between the second recess 818 and the vent hole recess 820 (called lateral channel 110), and the vent hole recess 820 become part of the second cavity 118. In some embodiments, the cap substrate 104 is then thinned down to remove a partial thickness after being bonded to the device substrate 102.

Figure 17:
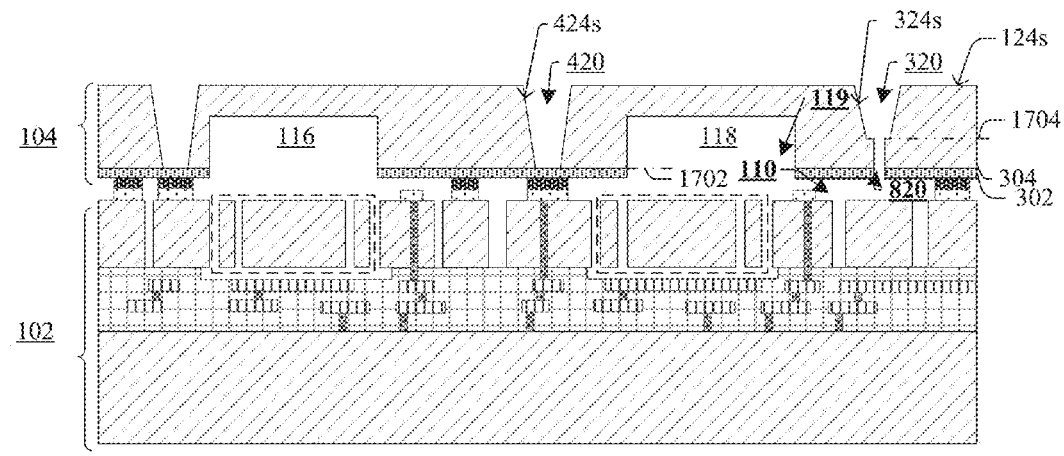

FIG. 17 shows a cross-sectional view corresponding to act 1208 according to some embodiments. In FIG. 17, patterning and etching are performed to form a TSV 420 and a vent opening 320 from a back side surface 124s of the cap substrate 104. The vent opening 320 is formed directly above the vent hole recess 820 and reaches the vent hole recess 820. A sidewall 424s of the TSV 420 and a sidewall 324s of the vent opening 320 have tilt angles that are substantially equal. In some embodiments, the vent opening 320 has dimensions (widths at same lateral levels and depths) that are smaller than that of the TSV 420. This can be achieved by preparing a mask having a smaller opening at corresponding positions of the vent opening 320 during the patterning. Due to etch loading effect, the achieved depth of the vent opening 320 (at a lateral level 1704) is smaller than that of the TSV 420 (at a lateral level 1702).

Figure 18:
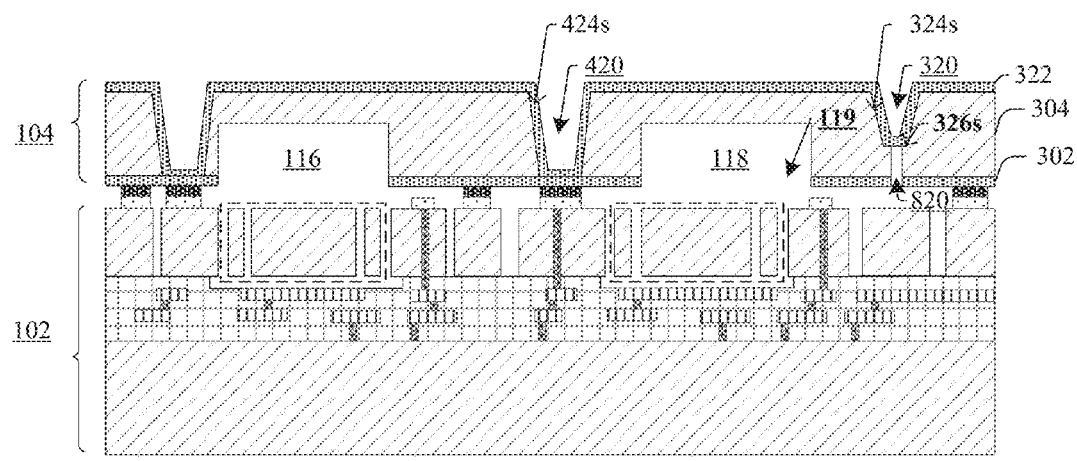

FIG. 18 shows a cross-sectional view corresponding to act 1210 according to some embodiments. In FIG. 18, the pressure of the ambient environment surrounding the bonded cap substrate 104 and device substrate 102 is changed to the second gas pressure, and gas diffusion is allowed to occur through the vent opening 320, between the ambient environment and the second cavity 118. Once the gas diffusion reaches a steady-state condition, the pressure within the second cavity 118 is equal to the second gas pressure. Then a sealing layer 322 is formed to seal the vent opening 320. In some embodiments, the sealing layer 322 can be formed in conformal from the back side surface 124s of the cap substrate 104, continuously along the sidewalls 424s of the vent opening 420 and the sidewalls 324s of the vent opening 320, covering the bottom surface 326s of the vent opening 320.

Figure 19:
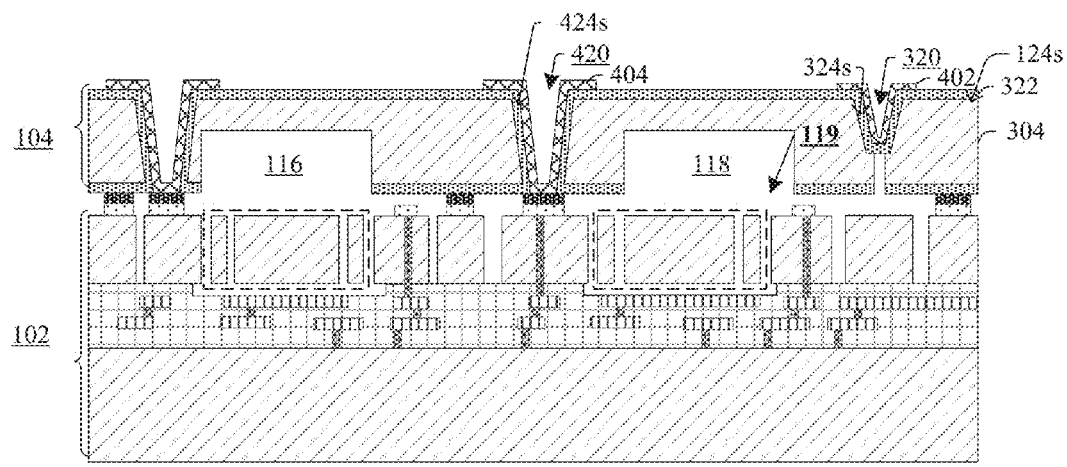

FIG. 19 shows a cross-sectional view corresponding to act 1212 according to some embodiments. In FIG. 19, in some embodiments, an etch is firstly performed to remove a portion of the sealing layer covering a bottom surface of the TSV 420. Then a metal layer is formed and patterned to leave a first portion 404 in the TSV 420 and a second portion 402 in the vent opening 320. The remaining portion of the metal layer may extend over the back side surface 124s of the cap substrate. In some embodiments, the metal layer if formed in conformal.

Figure 20A:
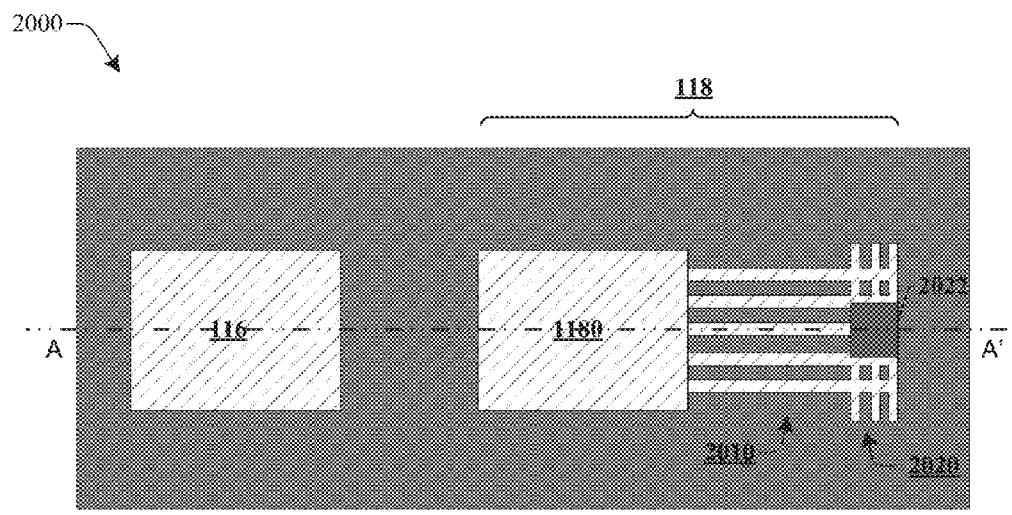
FIG. 20A illustrates a top view of some alternative embodiments of a MEMS package.
Figure 20B:
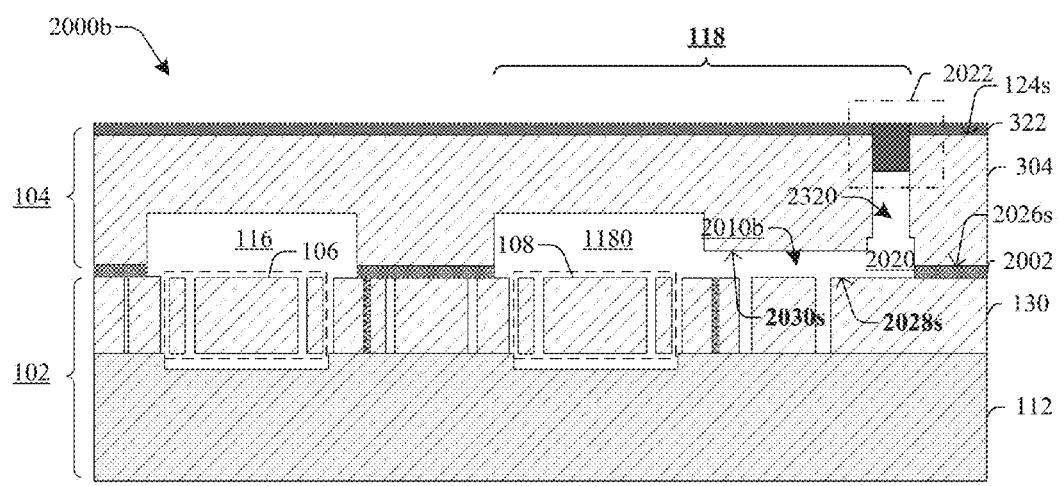
FIG. 20B illustrates a cross-sectional view of some alternative embodiments of a MEMS package of FIG. 20A along A-A'.
Figure 20C:
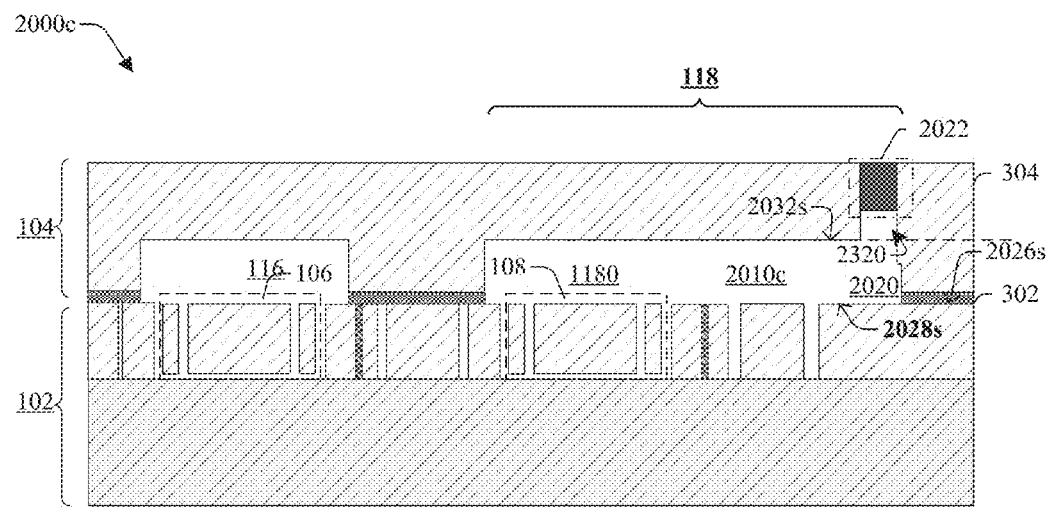
FIG. 20C illustrates a cross-sectional view of some alternative embodiments of a MEMS package of FIG. 20A along A-A'.
Figure 20D:
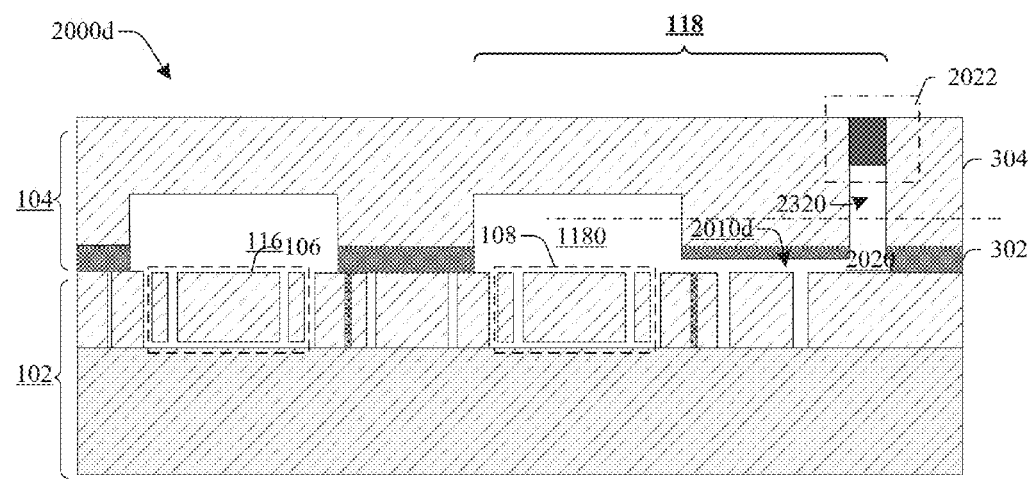
FIG. 20D illustrates a cross-sectional view of some alternative embodiments of a MEMS package of FIG. 20A along A-A'.

FIG. 20A shows a top view of a MEMS package 2000 according to some embodiments. FIGS. 20B-20D show some cross-sectional views of a MEMS package 2000b-d according to some embodiments. Referring to FIG. 20A and FIG. 20B, the MEMS package 2000 comprises a first cavity 116 corresponding to a first MEMS device 106 and a second cavity 118 corresponding to a second MEMS device 108. The first and second MEMS devices 106, 108 work under different stable pressures. The first and second cavities 116, 118 are enclosed by a device substrate and a cap substrate bonded together hermetically at a bond interface 2002. The second cavity 118 comprises a major volume 1180 and a plurality of vent holes 2020 connected by a plurality of lateral channels 2010. A vent opening 2320 is disposed directly above a center region of the plurality of the vent holes 2020 and hermetically sealed by a sealing structure 2022. In some embodiments, the device substrate 102 may comprise a MEMS substrate 130 having the first MEMS device 106 and the second MEMS device 108 disposed thereon and stacked to a semiconductor substrate 112 having active elements (e.g., a transistor). In some embodiments, the lateral channel 2010 (2010b) is disposed between the cap substrate 104 and the device substrate 102. In FIG. 20B, the lateral channel 2010b is disposed between a recessed surface 2030s of the cap substrate 104 and a top surface 2028s of the device substrate 102. Referring to FIG. 20C, in some other embodiments, the lateral channel 2010c is disposed between a surface 2032s of the cap substrate 104 that is at a same lateral level of the major volume 1180 and a top surface 2028s of the device substrate 102. Referring to FIG. 20D, in some other embodiments, the lateral channel 2010d is disposed between a recess of a dielectric layer 302 and a top surface of the device substrate 102. The vent hole 2320 is sealed by the sealing structure 2022 from a back side surface 124s of the cap substrate 104. In some embodiments, the first cavity 116 can be hermetically sealed by bonding pads, bonding rings, other bonding materials or directly bonding techniques and filled with a first gas at a first gas pressure; while the second cavity 118 is sealed hermetically by bonding and the sealing structure 2022 and filled with a second gas at a second gas pressure, which is different from the first gas pressure. By having multiple relative narrow and long lateral channels, unwanted impurities, such as residues from etching process for the vent opening 2320, can be blocked from the major volume 1180; and negative effects of the above impurities to the second MEMS device 108 can be eliminated or at least reduced.

Figure 21:
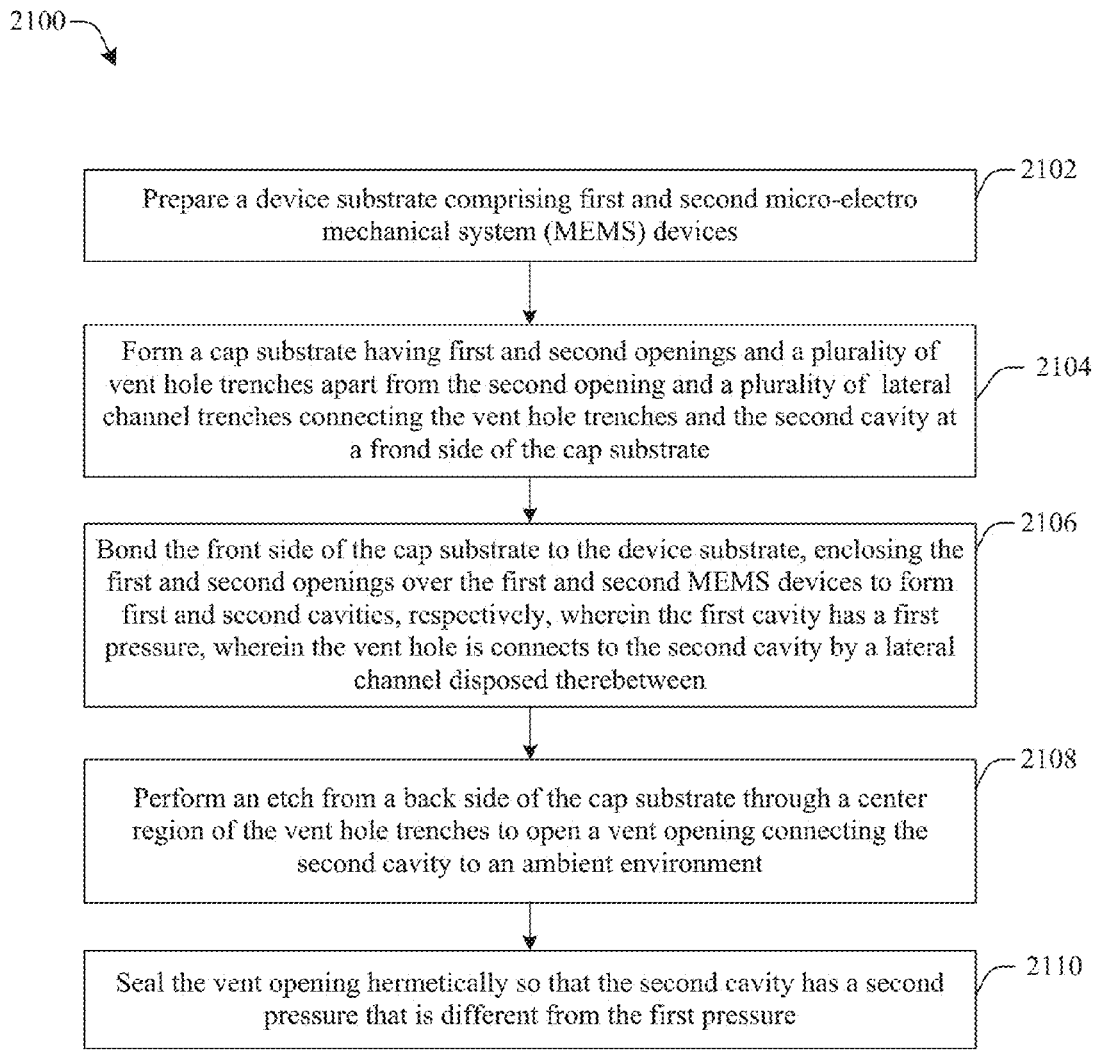
FIG. 21 illustrates a flow diagram of some alternative embodiments of a method for manufacturing a MEMS package.

FIG. 21 shows a flow diagram 2100 of a method for manufacturing a MEMS package according to some alternative embodiments. The MEMS package comprises two MEMS devices configured to work under different pressure. Examples of the MEMS package are shown in FIGS. 20A-20D.

While disclosed methods (e.g., methods 2100) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At action 2102, a device substrate is prepared. In some embodiments, the device substrate comprises a semiconductor substrate containing active elements (e.g., a transistor) that is bonded to a MEMS substrate containing first and second MEMS devices.

At action 2104, a cap substrate is formed having first and second openings and a plurality of vent hole trenches connected to the second opening by a plurality of lateral channel trenches at a front side of the cap substrate.

At action 2106, the cap substrate is bonded to the device substrate at the front side, enclosing the first and second openings over the first and second MEMS devices to form first and second cavities, respectively. The first cavity has a first pressure. The bonding also encloses the plurality of lateral channel trenches with the front side of the device substrate to form a plurality of lateral channels, wherein the plurality of vent hole trenches are connected to the second cavity by the plurality of lateral channels disposed therebetween.

At action 2108, an etch is performed from a back side of the cap substrate directly above a center region of the plurality of the vent hole trenches to open a vent opening connecting the second cavity to an ambient environment through the plurality of lateral channels and the plurality of the vent hole trenches.

At action 2110, the vent opening is sealed hermetically so that the second cavity has a second pressure that is different from the first pressure.

FIGS. 22A-22C through 25A-25C show a series of top views and cross-sectional views that collectively depict formation of a MEMS package according to some embodiments. Although FIGS. 22A-22C through 25A-25C are described in relation to the method 2100, it will be appreciated that the structures disclosed in FIGS. 22A-22C through 25A-25C are not limited to the method 2100, but instead may stand alone as structures independent of the method 2100. Similarly, although the method 2100 is described in relation to FIGS. 22A-22C through 25A-25C, it will be appreciated that the method 2100 is not limited to the structures disclosed in FIGS. 22A-22C through 25A-25C, but instead may stand alone independent of the structures disclosed in FIGS. 22A-22C through 25A-25C.

Figure 22A:
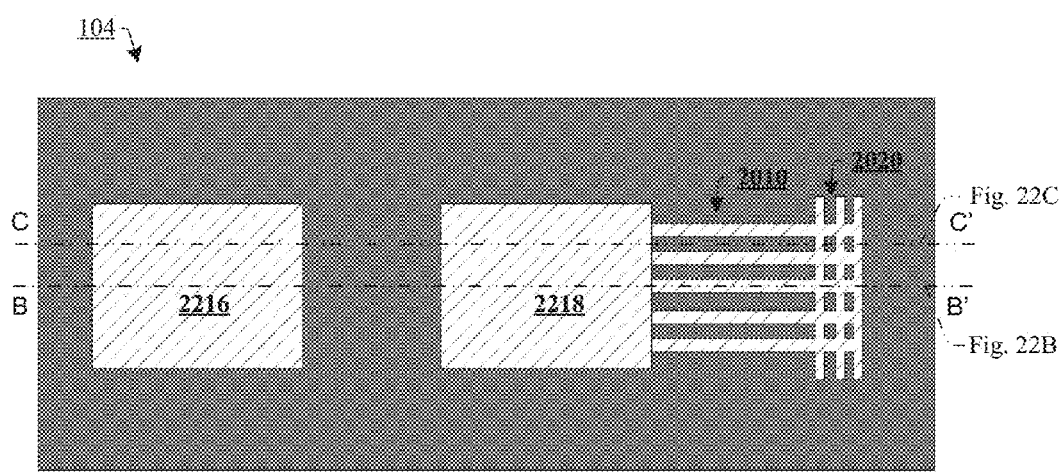
FIGS. 22A-22C through 25A-25C illustrate a series of cross-sectional views or top views of some alternative embodiments of a MEMS package at various stages of manufacture.
Figure 22B:
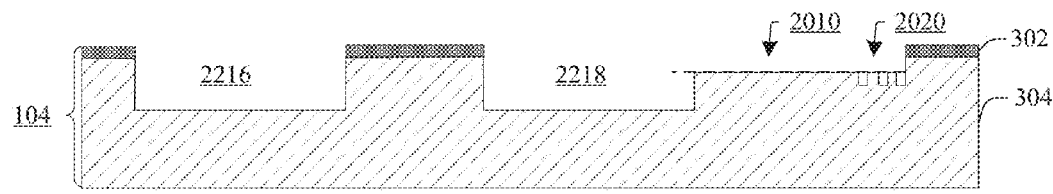
Figure 22C:
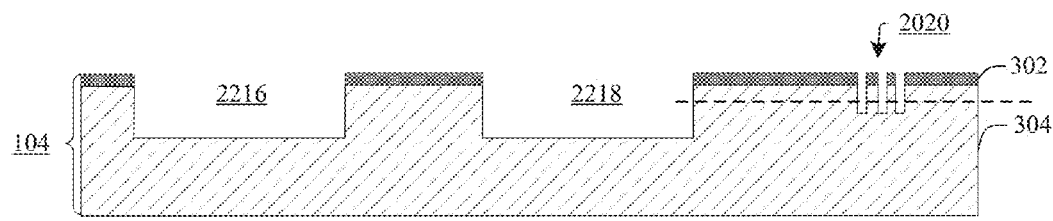

FIGS. 22A-C show a top view and some cross-sectional views corresponding to act 2104 according to some embodiments. As shown in FIGS. 22A-22C, a cap substrate 104 is formed having first opening 2216 and second opening 2218 and a plurality of vent hole trenches 2020 connected to the second opening 2218 by a plurality of lateral channel trenches 2010 at a front side of the cap substrate 104. FIG. 22B shows a cross-sectional view of the cap substrate 104 along a line B-B' in FIG. 22A, wherein one of the plurality of lateral channel trenches 2010 is formed by forming a recess from the front side of the cap substrate between the second opening 2218 and plurality of vent hole trenches 2020. FIG. 22B shows an example of some embodiments, where one or more layers (such as layer 302) over a substrate 304 is removed together with a top portion of the substrate 304. In some other embodiments, a top portion of one or more semiconductor layers (such as the layer 302) disposed over the substrate 304, such as a passivation layer, or a bonding material layer is removed to form the plurality of lateral channel trenches 2010. An example of a MEMS package formed by this approach is shown in FIG. 20D. FIG. 22C shows a cross-sectional view of the cap substrate 104 along a line C-C' in FIG. 22A between two of the plurality of lateral channel trenches 2010. In some embodiments, the vent hole trenches 2020 have a depth in a range of 10 um~100 um, a width in a range of 1~20 um, and a length in a range of 10~100 um. In some embodiments, the plurality of lateral channel trenches 2010 have a uniform depth that is larger than 0.3 μm, a uniform width in a range of from about 0.5 μm to about 5 μm, and a length in a range of 10~1000 um. In some other embodiments, the plurality of lateral channel trenches 2010 have different, varying depths and widths. The shape of the plurality of lateral channel trenches 2010 can be straight lines, serpentine lines or other applicable patterns.

Figure 23A:
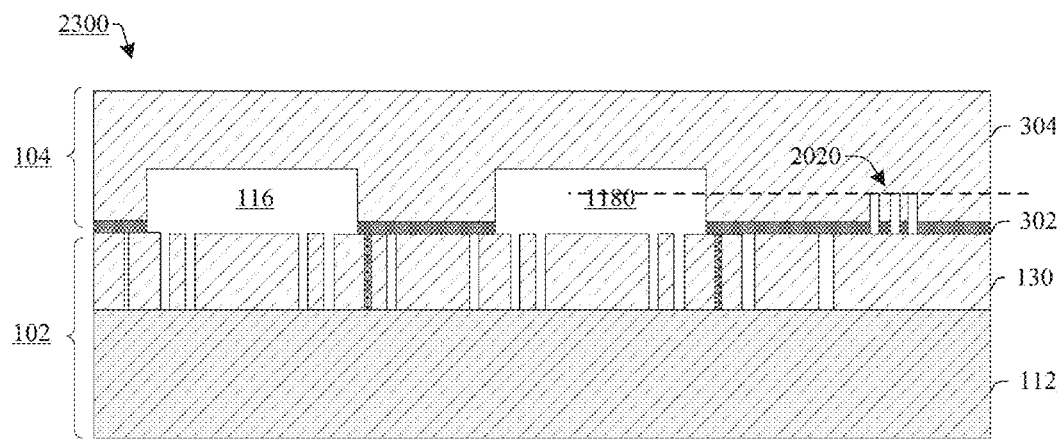
Figure 23B:
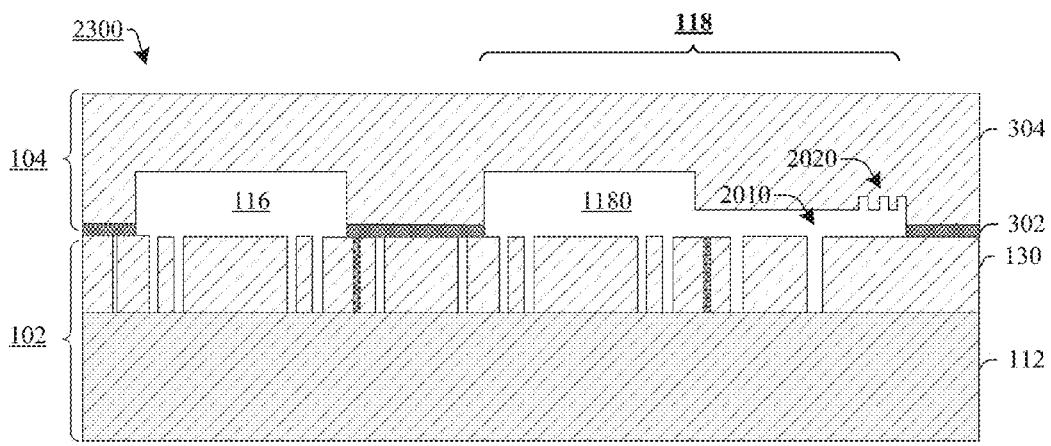

FIGS. 23A-23B show cross-sectional view corresponding to act 2106 according to some embodiments. In FIGS. 23A-23B, the cap substrate 104 is flipped over and bonded to a device substrate 102. FIG. 23A shows a cross-sectional view of a bonded substrate 2300 along line C-C' in FIG. 22A. FIG. 23B shows a cross-sectional view of the bonded substrate 2300 along line B-B' in FIG. 22A. The device substrate 102 has been prepared through one or more fabrication processes. For example, the semiconductor substrate 112 includes one or more active elements. The MEMS substrate including first and second MEMS devices are formed over an upper surface of the semiconductor substrate 112. The cap substrate 104 and the device substrate 102 can be bonded by any applicable bonding techniques. Upon bonding, the first recess 2216 becomes part of the first cavity 116; and the second recess 2218, the lateral channel trenches 2010, and the vent hole trenches 2020 become part of the second cavity 118. In some embodiments, the cap substrate 104 is then thinned down to remove a partial thickness after being bonded to the device substrate 102.

Figure 24A:
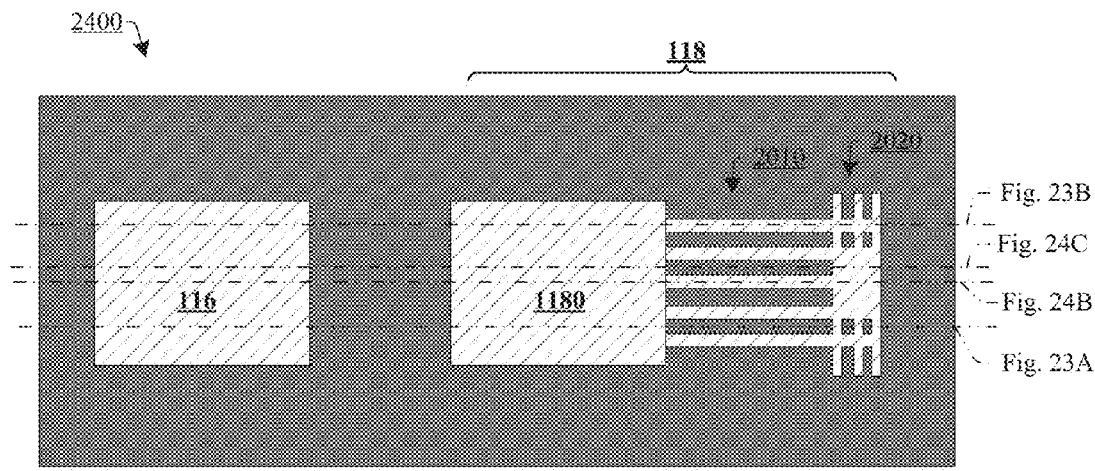
Figure 24B:
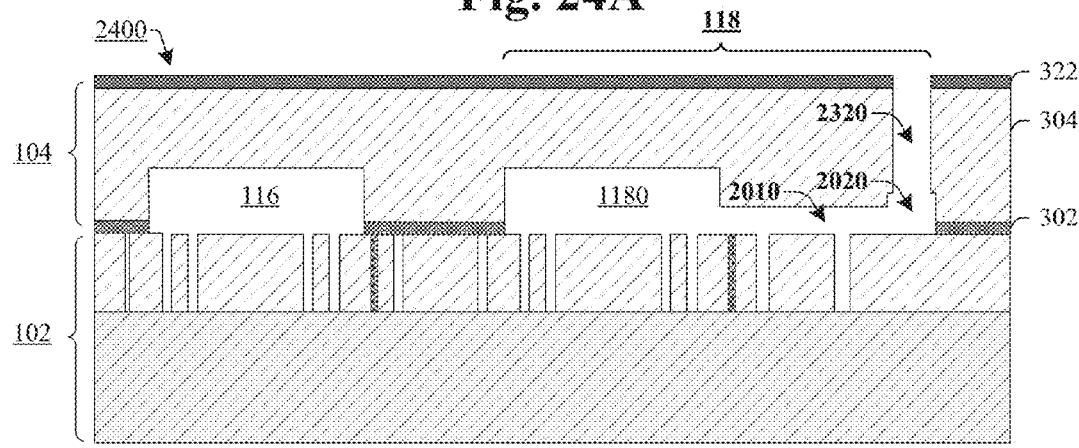
Figure 24C:
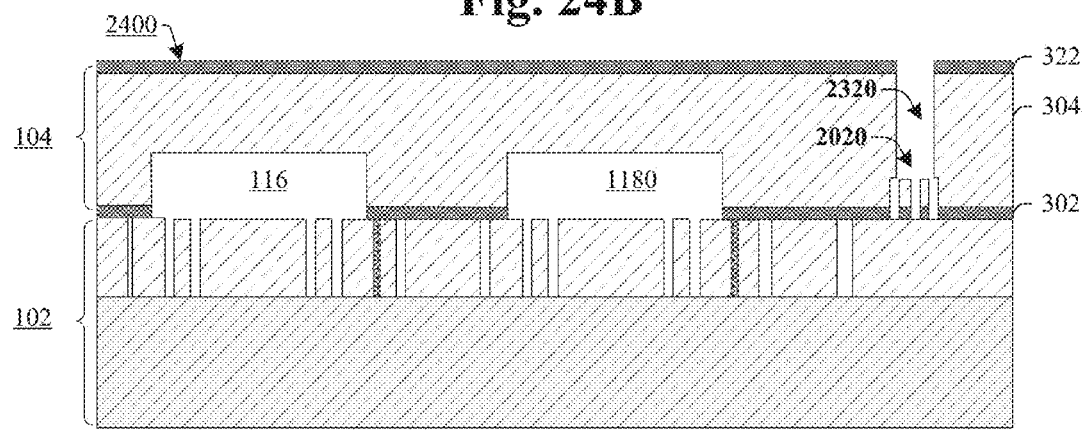

FIGS. 24A-24C show a top view and some cross-sectional views corresponding to act 2108 according to some embodiments. In FIGS. 24A-24C, patterning and etching are performed to a vent opening 2320 from a back side of the cap substrate 104 directly above a center region of the plurality of vent hole trenches 2020. The vent opening 2320 is formed to reach a lateral level of the plurality vent hole trenches 2020 to connect the second opening 1180 to an ambient environment as shown in FIG. 24B. FIG. 24C shows a cross-sectional view of the bonded substrate 2400 along a line between two of the plurality of the lateral channels.

Figure 25A:
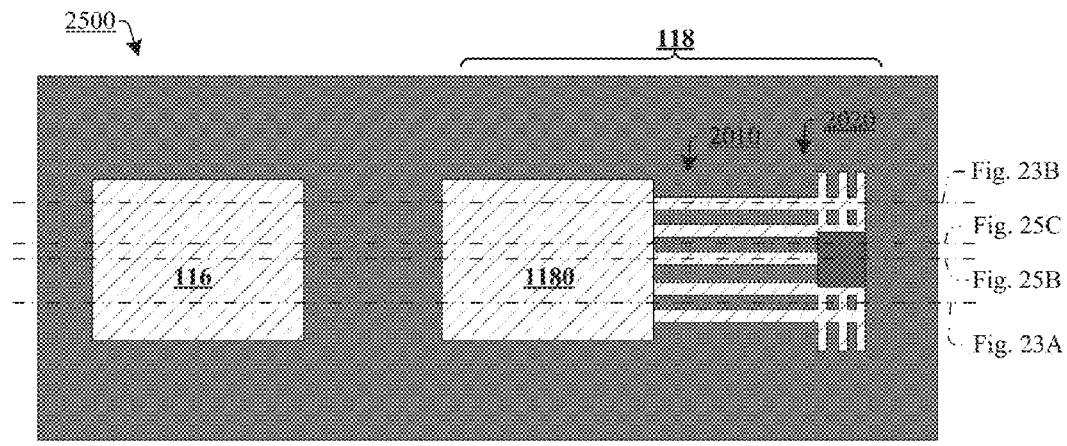
Figure 25B:
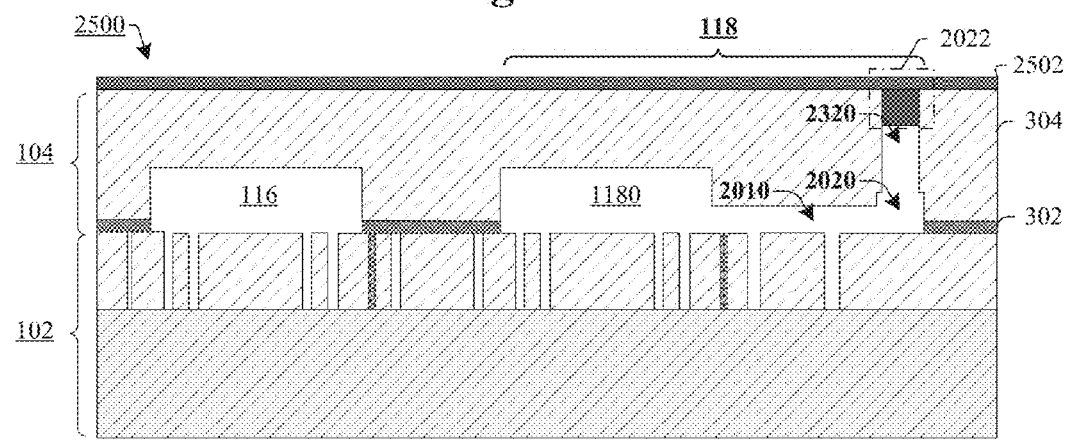
Figure 25C:
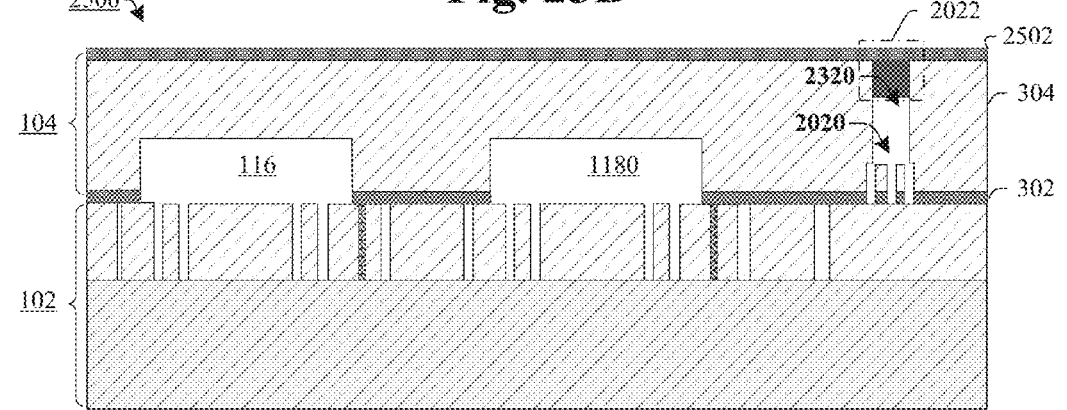

FIGS. 25A-25C show cross-sectional views corresponding to act 2110 according to some embodiments. In FIG. 25A-25C, the pressure of the ambient environment surrounding the bonded substrate 2500 is changed to the second gas pressure, and gas diffusion is allowed to occur through the vent opening 2320, between the ambient environment and the second cavity 118. Once the gas diffusion reaches a steady-state condition, the pressure within the second cavity 118 is equal to the second gas pressure. Then a sealing structure 2022 is formed to hermetically seal the vent opening 2320. In some embodiments, a passivation layer 2502 may be formed after sealing the vent opening 2320.

Thus, as can be appreciated from above, the present disclosure relates to a MEMS package and associated methods. A device substrate and a cap substrate are bonded together. The bonded substrate comprises a first cavity corresponding to a first MEMS device having a first pressure and a second cavity corresponding to a second MEMS device having a different second pressure. In some embodiments, the second cavity comprises a major volume and a vent hole connected by a lateral channel disposed between the device substrate and the cap substrate and the vent hole is hermetically sealed by a sealing structure.

In some embodiments, the present disclosure relates a MEMS package. The MEMS package comprises a device substrate having first and second MEMS devices. The MEMS package further comprises a cap substrate bonded to the device substrate, enclosing a first cavity over the first MEMS device and a second cavity over the second MEMS device. The second cavity comprises a major volume and a vent hole connected by a lateral channel disposed between the device substrate and the cap substrate. The vent hole is sealed by a sealing structure, defining a second pressure of the second cavity, which is different from a first pressure of the first cavity.

In other embodiments, the present disclosure relates to a method for manufacturing a microelectromechanical systems (MEMS) package. The method comprises preparing a device substrate comprising first and second MEMS devices. The method further comprises forming a cap substrate having first and second openings and a vent hole apart from the second opening at a frond side of the cap substrate. The method further comprises bonding the front side of the cap substrate to the device substrate, enclosing the first opening over the first MEMS device to form a first cavity having a first pressure, enclosing the second opening over the second MEMS device to form a second cavity. The enclosed second opening is connected to the vent hole through a lateral channel formed therebetween. The method further comprises sealing the vent hole hermetically so that the second cavity has a second pressure that is different from the first pressure.

In yet other embodiments, the present disclosure relates to a MEMS package. The MEMS package comprise a first MEMS device comprising a first cavity hermetically sealed at a first gas pressure and a second MEMS device comprising a second cavity hermetically sealed at a second gas pressure that is different from the first gas pressure. The second cavity comprises a vent hole spaced apart from a major volume by a lateral channel. The vent hole is hermetically sealed by a sealing structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical systems (MEMS) package comprising:
   a device substrate comprising first and second MEMS devices which are arranged laterally with respect to one another; and
   a cap substrate bonded to the device substrate, enclosing a first cavity over the first MEMS device and a second cavity over the second MEMS device; wherein the second cavity comprises a major volume and a vent hole laterally connected by a lateral channel disposed between the device substrate and the cap substrate;
   wherein the vent hole is sealed by a sealing structure, defining a second pressure of the second cavity, which is different from a first pressure of the first cavity;
   wherein the lateral channel has a first vertical distance from a first lateral plane of the cap substrate to an upper surface of the device substrate, and the major volume has a second vertical distance from a second lateral plane of the cap substrate to the upper surface of the device substrate, the first vertical distance being less than the second vertical distance.

2. The MEMS package of claim 1, wherein the vent hole has a titled sidewall with a tilt angle ranging from about 45 degrees to about 95 degrees.

3. The MEMS package of claim 1, wherein the sealing structure comprises a first sealing layer comprising a first metal layer and a dielectric sealing layer disposed within the vent hole under the first sealing layer.

4. The MEMS package of claim 3, wherein the first sealing layer is a conformal layer extending over a portion of a back side surface of the cap substrate and covered by a conformal passivation layer disposed thereon.

5. The MEMS package of claim 3, further comprising a second metal layer disposed along sidewalls of the vent hole, extending over a portion of a back side surface of the cap substrate.

6. The MEMS package of claim 1, further comprising a vent opening disposed directly above the vent hole, wherein a sidewall of the vent opening is tilted and a width of the vent opening is wider than that of the vent hole.

7. The MEMS package of claim 6, wherein the vent opening is sealed by a metal layer stacked on a conformal dielectric layer, wherein the conformal dielectric layer continuously extends over a back side surface of the cap substrate.

8. The MEMS package of claim 6, wherein the vent hole has a depth that is smaller than that of the first and second cavities.

9. The MEMS package of claim 1, further comprising:
   a through substrate via (TSV) extending through the cap substrate and electrically coupled to MEMS devices of the device substrate by a metal layer; and
   a vent opening disposed directly above the vent hole, wherein a sidewall of the vent opening has a tilt angle that is substantially same with that of the TSV;
   wherein the vent opening is sealed by the metal layer stacked on a conformal dielectric layer, wherein the conformal dielectric layer extends over a back side surface of the cap substrate and sidewalls of the TSV.

10. The MEMS package of claim 1, further comprising a plurality of lateral channels connecting the major volume and the vent hole of the second cavity.

11. The MEMS package of claim 10, further comprising a plurality of vent holes disposed under a vent opening, wherein the vent opening has a width that is larger than that of the plurality of vent holes.

12. The MEMS package of claim 11, wherein the plurality of lateral channels has widths that are smaller than that of the plurality of vent holes.

13. A microelectromechanical systems (MEMS) package comprising:
   a first MEMS device comprising a first cavity hermetically sealed at a first gas pressure; and
   a second MEMS device laterally arranged with respect to the first MEMS device and comprising a second cavity hermetically sealed at a second gas pressure that is different from the first gas pressure;
   wherein the second cavity comprises a vent hole laterally spaced apart from a major volume by a lateral channel;
   wherein the vent hole is hermetically sealed by a sealing structure;
   wherein the vent hole is laterally spaced apart from the second MEMS device.

14. The MEMS package of claim 13, wherein the sealing structure comprises at least a metal material stacked over a conformal dielectric material.

15. The MEMS package of claim 13, further comprising a vent opening disposed directly above and connected to the vent hole, wherein a width of the vent opening is larger than that of the vent hole and the sealing structure is filled in the vent opening.

16. The MEMS package of claim 13, further comprising a plurality of vent holes and lateral channels connected to the second cavity, wherein widths of the plurality of vent holes are greater than that of the plurality of the lateral channels.

17. A microelectromechanical systems (MEMS) package comprising:
- a cap substrate bonded to a device substrate, the cap substrate enclosing a first cavity over a first MEMS device and a second cavity over a second MEMS device, wherein the second cavity comprises a major volume and a vent hole array connected by a lateral channel array;
- wherein the lateral channel array has a depth from a top surface of the cap substrate that is less than that of the major volume;
- wherein the vent hole array comprises a plurality of vent holes disposed within the cap substrate and parallel to one another.

18. The MEMS package of claim 17, wherein the first cavity is hermetically sealed at a first gas pressure and a second cavity is hermetically sealed at a second gas pressure that is different from the first gas pressure.

19. The MEMS package of claim 17, further comprising a vent opening disposed from a back side of the cap substrate to the vent hole array, wherein the vent opening is sealed by a sealing structure.

20. The MEMS package of claim 19, wherein the sealing structure comprises a metal material stacked on a conformal dielectric material.

\* \* \* \* \*